US006690076B1

United States Patent
Fossum et al.

(10) Patent No.: US 6,690,076 B1
(45) Date of Patent: Feb. 10, 2004

(54) STITCHED CIRCUITS LARGER THAN THE MAXIMUM RETICLE SIZE IN SUB-MICRON PROCESS

(75) Inventors: Eric R. Fossum, La Crescenta, CA (US); Anders Andersson, Pasadena, CA (US); David Schick, Flushing, NY (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/523,127

(22) Filed: Mar. 10, 2000

Related U.S. Application Data

(60) Provisional application No. 60/123,582, filed on Mar. 10, 1999.

(51) Int. Cl.[7] .................. H01L 27/146; H01L 31/00
(52) U.S. Cl. .................. 257/431; 257/202; 257/222; 257/459; 257/466; 257/909
(58) Field of Search ................. 257/202, 222, 257/431, 459, 466, 909

(56) References Cited

U.S. PATENT DOCUMENTS

| 4,972,255 A | * 11/1990 | Suzuki et al. ................. 358/75 |
| 5,132,195 A | 7/1992 | Pool |
| 5,349,174 A | 9/1994 | Van Berkel et al. |
| 5,512,766 A | 4/1996 | Kusunoki et al. |
| 5,652,163 A | 7/1997 | Schinella et al. |
| 5,801,406 A | 9/1998 | Lubow et al. |
| 6,100,951 A | 8/2000 | Oversluizen et al. |

OTHER PUBLICATIONS

G. Kreider et al, "An mK × nK Modular Image Sensor Design," IEDM Technical Digest 1995 p. 155.
Albert Theuweissen, "Modular CCDs: Building Blocks for Large–Area Sensors," Photonics Spectra article Jan. 1997.
Mike Halloran, "Modular Image Sensor Design Reduces Development Cost of Large Area CCDs," Phillips homepage Dec. 1998.
S.N. Lee et al, Session 13: Image Sensors, Processors, and Displays, FAM 13.5: A 5x9 Inch Polysilicon Gray–Scale Color Head Down Display Chip, ISSCO 90, Feb. 16, 1990 Imperial Ballroom.
"Philips Building Block Image and Sensor Family Keeps Growing" Mar. 1997, www.be.philips.com/ppi/wnew/march97.htm.
"An Innovative 2048×2048 Pixel Image Sensor," Jun. 1996 www.be.philips.com/ppi/wnew/june96.htm.

* cited by examiner

Primary Examiner—Jerome Jackson
(74) Attorney, Agent, or Firm—Dickstein Shapiro Morin & Oshinsky LLP

(57) ABSTRACT

A circuit having a plurality of circuit blocks formed on a semiconductor substrate is disclosed. The circuit blocks are stitched together by appropriately connecting input and output lines of the plurality of circuit blocks. The circuit also includes connecting circuits coupled to the plurality of circuit blocks. The connecting circuits provide low voltage drop across boundaries where the plurality of circuit blocks are stitched together.

11 Claims, 4 Drawing Sheets

US 6,690,076 B1

STITCHED CIRCUITS LARGER THAN THE MAXIMUM RETICLE SIZE IN SUB-MICRON PROCESS

CROSS REFERENCE TO RELATED APPLICATION

This application claims the benefit of U.S. Provisional Application No. 60/123,582, filed on Mar. 10, 1999.

BACKGROUND

This disclosure relates to integrated circuit fabrication.

As integrated circuit (IC) fabrication technique advances, semiconductor manufacturers continue to develop techniques to construct integrated circuits with structures having dimensions in the sub-micron range on a semiconductor substrate. Improvements in photolithographic processing techniques have substantially contributed to the miniaturization of active semiconductor devices to dimensions below a single micron. The fabrication of these semiconductor devices often involves the transfer of circuit patterns from a photolithographic mask or reticle onto a photoresist layer. The process uses an imaging lens apparatus.

The reticle is often itself constructed from a substrate of silicon dioxide. The reticle can be patterned with areas of differing transmissivity thereon. The patterned areas of the reticle represent either the positive or negative images of an integrated circuit structure. After being properly positioned and aligned over the semiconductor wafer, the reticle is subjected to electromagnetic radiation. The radiation passes through transparent portions of the reticle, striking portions of the photoresist layer on the wafer. The resist coating is developed and etched so as to impart a positive or negative image of the reticle pattern onto the photoresist layer remaining on the wafer.

Conventional photolithographic methods of fabricating integrated circuits on a substrate often involve stepping a reticle and imaging apparatus across a photoresist coated wafer. The methods also involve repeatedly transferring the reticle image pattern to adjacent areas on the wafer. Each of the individual areas on the wafer containing the circuitry image is termed a die. The wafer is cut or otherwise segmented at the end of the fabrication process so that the dice are separated from one another for subsequent packaging as individual integrated circuit chips.

As integrated circuits become increasingly complex, however, the integrated circuit structures within an individual die have become significantly smaller and denser. Larger reticles are often required to transfer larger and more complex circuit images to substrate fields of increased dimensions. Because of inherent image resolution limitations associated with conventional photolithographic processes, imaging and alignment errors are often introduced when fine line structures having sub-micron dimensions are produced on relatively large reticles. Further, steppers used in photolithographic process also set the limit on the size of the printed circuit.

SUMMARY

The inherent limitations associated with producing relatively large reticles having structures with sub-micron dimensions have motivated development of different types of integrated circuits (IC) with larger fields. One type of circuit includes a plurality of circuit blocks formed on a semiconductor substrate. The circuit blocks are stitched together by appropriately connecting input and output lines of the plurality of circuit blocks. The circuit also includes connecting circuits coupled to the plurality of circuit blocks. The connecting circuits provide low voltage drop across boundaries where the plurality of circuit blocks are stitched together.

BRIEF DESCRIPTION OF THE DRAWINGS

Different aspects of the disclosure will be described in reference to the accompanying drawings wherein.

DETAILED DESCRIPTION

The inherent limitations associated with producing relatively large reticles having structures with sub-micron dimensions have motivated development of new methods of fabricating integrated circuits (IC) with larger fields. One such photocomposition method, known as "stitching," is directed to producing larger reticle fields by sub-dividing the circuitry pattern. The sub-field patterns are then stitched or recomposed to form a large composite circuit field thereon.

Figure 1:
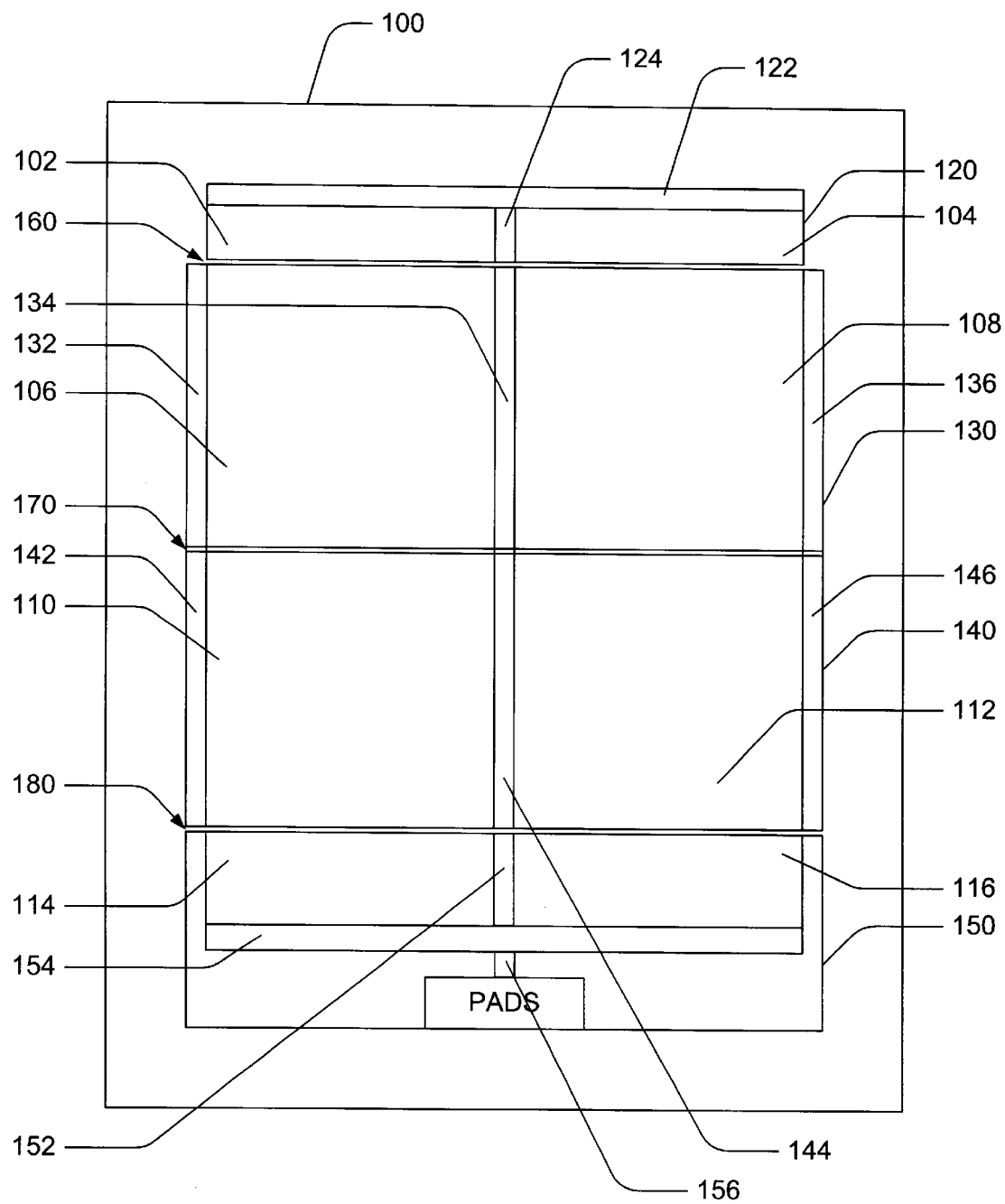
FIG. 1 shows a substrate having a composite field fabricated using stitching technique in accordance with one aspect of the present invention.

As illustrated in FIG. 1 of the drawings, a substrate having a field 100 is shown as a composite field fabricated using the stitching technique. Often, a field 100 is image patterns of an integrated circuit structure. In the illustrated embodiment, the field 100 is a representation of the image patterns of a large image sensor having a large pixel sensor array 102–116. The large image sensors are well suited for stitching because many parts of the sensors are duplicative.

The substrate circuit is constructed by first photolithographically patterning smaller sub-fields 120, 130, 140, 150, with each sub-field bearing a portion of the image pattern of the integrated circuit structure. The sub-fields 120, 130, 140, 150 are then stitched together along stitching boundaries 124, 134, 144, 152, 160, 170, 180 to form the composite field 100. The image patterns of sub-fields 120, 130, 140, 150 substantially adjoin each other with a high accuracy in order to avoid any alignment errors that otherwise occur with respect to the millions of fine line interconnections necessary to "re-connect" adjacent sub-fields along the stitching boundaries 124, 134, 144, 152, 160, 170, 180. Each of the sub-fields 120, 130, 140, 150 contains one or more functional blocks, which together form a complex integrated system.

For some embodiments of the large image sensors, there are areas near the stitching boundaries 124, 134, 144, 152, 160, 170, 180 where there are no pixel coverage. To minimize the area with no pixel coverage, a shift register for the row select and reset select circuit have been incorporated into the middle of the pixel array. The circuit field 100 of the large image sensor includes a pixel sensor array 102–116, pixel signal routing areas 122, 132, 136, 142, 146, a row logic 134, 144, a column logic 154, and a readout logic 156.

Figure 2:
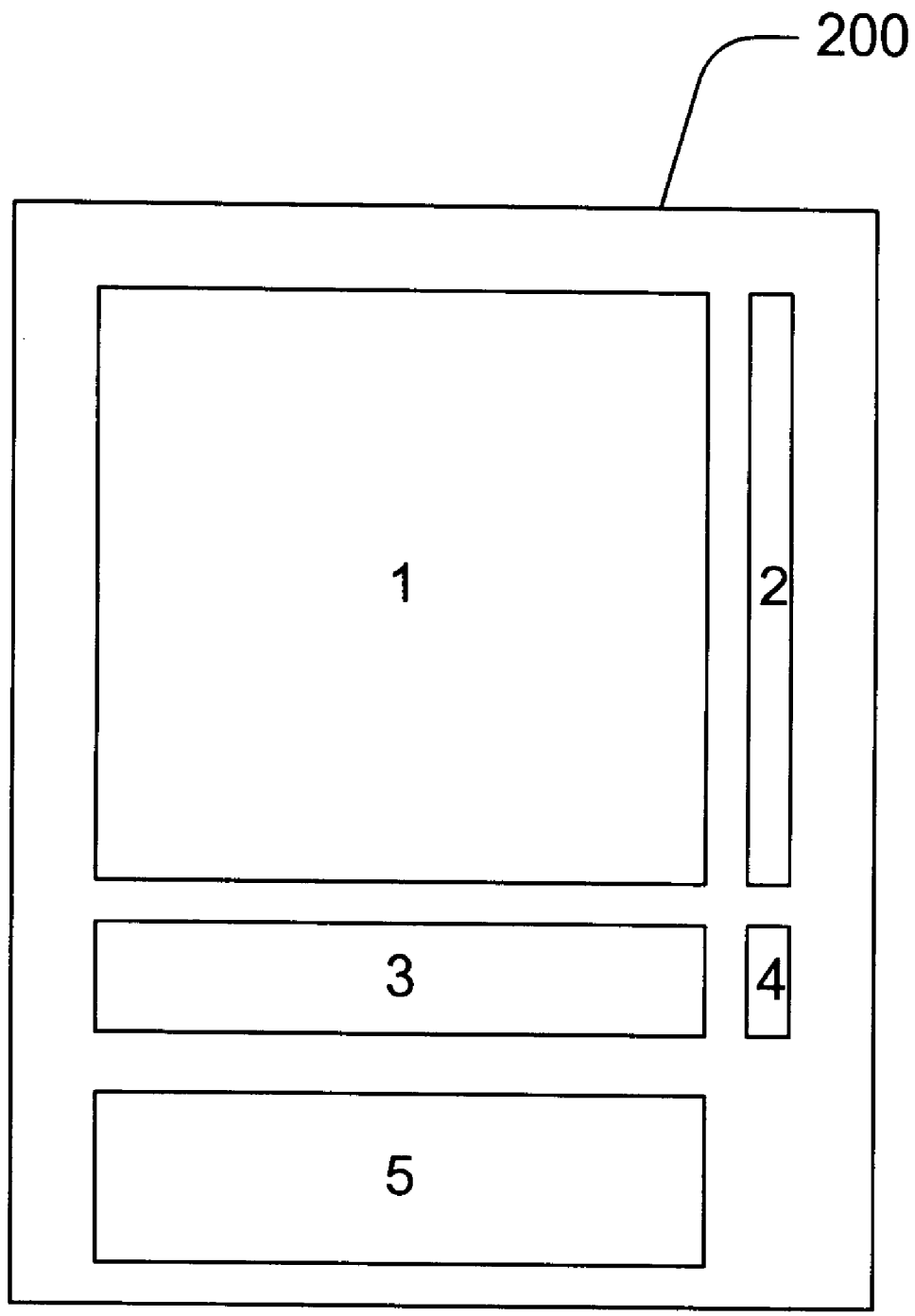
FIG. 2 shows sub-fields on a reticle corresponding to each function block.

Individual sets of reticles are initially patterned with images representative of the circuitry structures comprising each of the function blocks 102–116, 122–124, 132–136, 142–146, 152–156. Each function block is preferably defined within a single field on the reticle 200 as shown in FIG. 2. For example, the field 1 corresponds to the function blocks 106–112 while the field 3 corresponds to the function blocks 102, 104. The image patterns comprising each of the fields on the reticle 200 corresponding to the function blocks 102–116, 122–124, 132–136, 142–146, 152–156 are then transferred to the substrate. Upon completion of the initial transfer of function block image patterns from the individual fields to the substrate, each of the function block patterns on the field 100 can be considered to be electrically independent with respect to all other function blocks. Considering, for example, function blocks 102–116, a plurality of row and column pixel currents flow through the lines and preferably terminate at predetermined locations along the perimeters of the blocks 102–116. To minimize the voltage drops across the areas between the blocks 102–116, the areas 124, 134, 144, 152 have been designed with stitching circuits, such as row and column select circuits having shift registers. These circuits are designed with minimal power dissipation.

Figure 3:
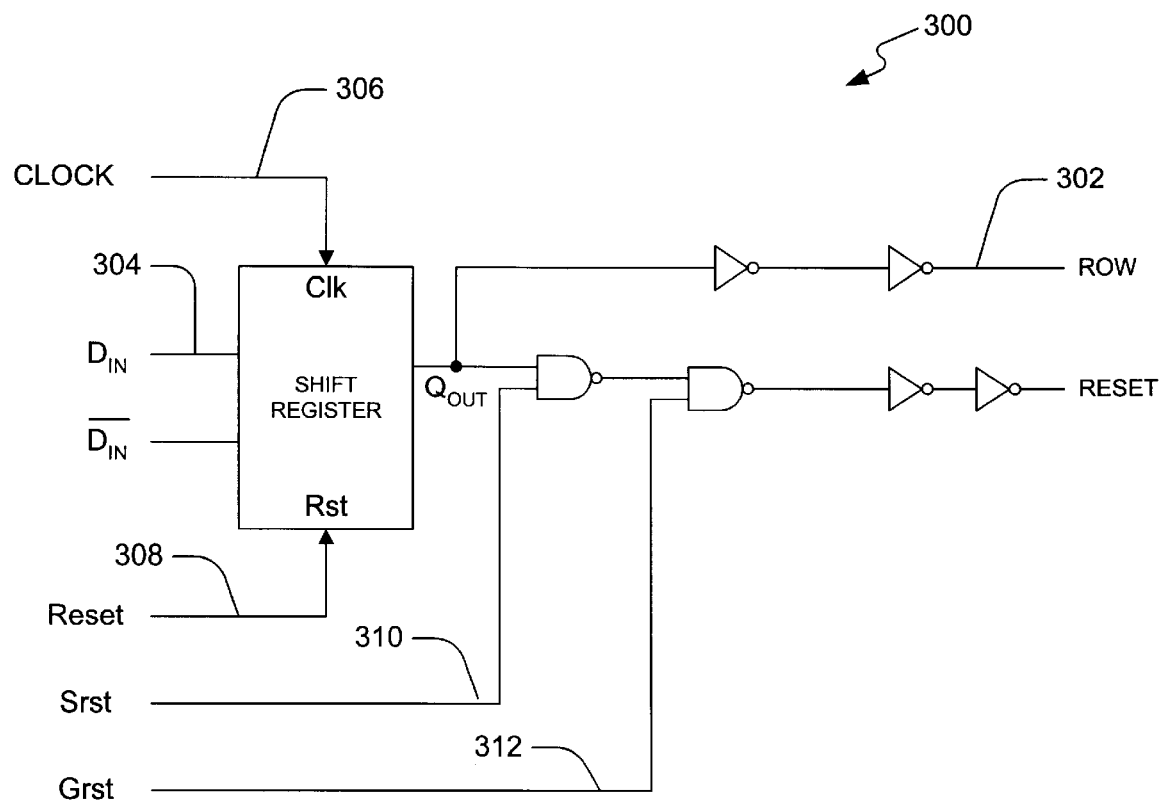
FIG. 3 is a schematic diagram of a row select circuit in accordance with one aspect of the present invention.
Figure 4:
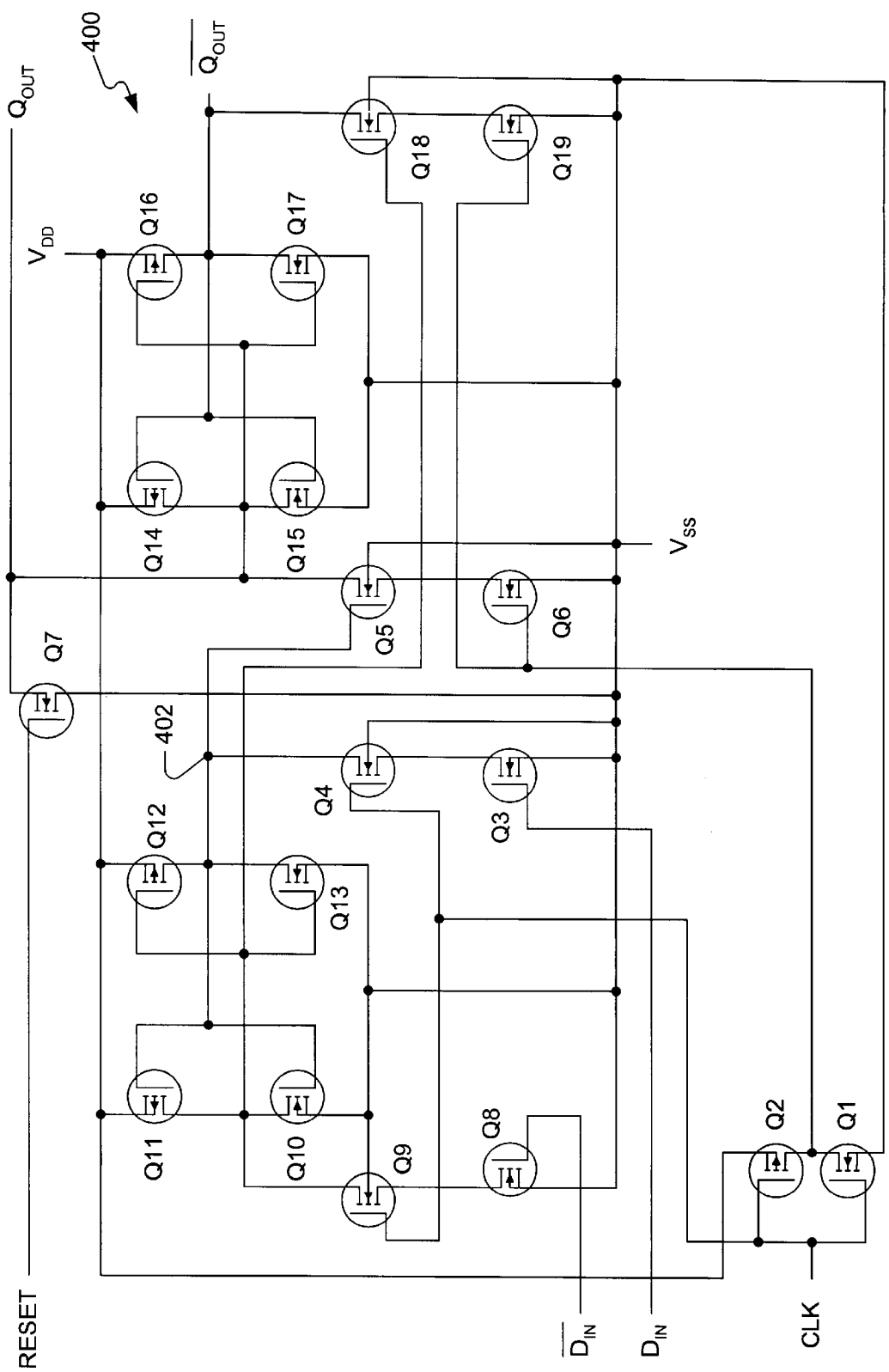
FIG. 4 is a schematic diagram of a shift register in accordance with one aspect of the present invention.

FIGS. 3 and 4 illustrate the row select circuit 300 and the shift register 400 in accordance with one aspect of the present invention. To minimize the logic, the shift register 400 shown in FIG. 4 can implement the column select logic as well. The row select circuit 300 selects the row 302 indicated by the input 304 at the edge of the clock signal 306. The input 304 can be reset with a reset signal 308. The selected row 302 can be reset with an Srst signal 310. The global reset signal 312, Grst, resets the entire array.

The shift register 400 receives a clock signal and sends the signal to the gate terminals of the transistors Q1, Q2, and Q4. The input signal drives the gate terminal of the transistor Q3. The transistor Q3, in conjunction with the transistor Q4, drives the node 402 either to high ($V_{DD}$) or low voltage ($V_{SS}$), depending on the voltage level of the input signal. The node 402 can be pulled up through the transistors Q10 and Q11. The pull-up is triggered by the clock signal using the transistors Q9, Q12, and Q13. The node 402 can be pulled down through the transistors Q3 and Q4. The pull-down is triggered by the inverse clock signal using the transistors Q5 and Q6. The transistor Q5 drives the output. The transistors Q14 to Q19 drive the inverse output. The shift register 400 can be reset by a reset signal through the transistor Q7.

With the stitched circuit of the present invention, resolution can be increased without reducing the field size or increasing the lens size. An area larger than the maximum reticle size can be formed by appropriately stitching the blocks with row and column select circuits and shift registers in accordance with some aspects of the present invention. The resultant area has increased the resolution producible with lens without increasing the lens size or decreasing the field size.

Accordingly, the complexity and functionality of each function block may be dramatically increased, resulting in large part from the ability to utilize a maximum available reticle field area for the integrated circuitry defining each function block.

Above described aspects and embodiments are for illustrative purposes only. Other embodiments and variations are possible. For example, the concept of connecting the seams with select circuits and shift registers can be used in circuits other than the image sensors, such as any integrated circuits having large duplicative areas.

All these are intended to be encompassed by the following claims.

What is claimed is:

1. An image sensor field on a semiconductor substrate comprising:

a plurality of sensing sub-fields arranged to collectively form a pixel sensor array;

a plurality of signal routing areas coupled with the plurality of sensing sub-fields;

read out logic; and signal selecting circuitry arranged in the interior of the pixel sensor array between adjacent ones of the sub-fields and coupling the plurality of sensing sub-fields with the read out logic.

2. The image sensor of claim 1, wherein the signal selecting circuitry comprises a row select circuit and a column select circuit.

3. The image sensor of claim 2, wherein the signal selecting circuitry further comprises circuitry to reset the pixel sensor array.

4. The image sensor of claim 1, wherein the signal selecting circuitry comprises a shift register.

5. The image sensor of claim 4, wherein the signal selecting circuitry further comprises circuitry to reset the pixel sensor array.

6. A method of manufacturing an image sensor, the method comprising:

creating a plurality of function blocks in an image sensor field on a semiconductor substrate such that the function blocks include a plurality of sensing blocks, a plurality of signal routing blocks, and a read out block, and such that each of the plurality of sensing blocks collectively form a pixel sensor array to generate signals, and a signal selecting circuit to arrange the generated signals onto one or more output lines; and stitching the plurality of function blocks together such that the signal selecting circuit is arranged in the interior of the pixel sensor array between adjacent ones of the sensing blocks.

7. The method of claim 6, wherein the signal selecting circuit comprises a row select circuit and a column select circuit.

8. The method of claim 7, wherein the signal selecting circuit further comprises circuitry to reset the pixel sensor array.

9. The method of claim 6, wherein the signal selecting circuit comprises a shift register.

10. The method of claim 9, wherein the signal selecting circuit further comprises circuitry to reset the pixel sensor array.

11. The method of claim 6, wherein the creation of the plurality of function blocks comprises stepping a single reticle across the semiconductor substrate, the single reticle having fields for each function block.

* * * * *